United States Patent [19]

Kim

[11] Patent Number: 5,093,702
[45] Date of Patent: Mar. 3, 1992

[54] METHOD OF ALIGNMENT FOR SEMICONDUCTOR MEMORY DEVICE

[75] Inventor: Gabe Kim, Folsom, Calif.

[73] Assignee: NEC Electronics, Inc., Mountain View, Calif.

[21] Appl. No.: 276,996

[22] Filed: Nov. 28, 1988

[51] Int. Cl.$^5$ .............................................. H01L 29/68
[52] U.S. Cl. .................................... 357/23.6; 357/23.9; 357/51
[58] Field of Search ................... 357/23.6, 23.9, 51, 357/54

[56] References Cited

U.S. PATENT DOCUMENTS 4,451,841  5/1984  Hori et al. .......................... 357/23.6
4,763,178  8/1988  Sakui et al. ........................ 357/23.6

FOREIGN PATENT DOCUMENTS 56-153762  11/1981  Japan .................................. 357/23.6
59-121866  7/1984  Japan .................................. 357/23.9

Primary Examiner—Andrew J. James
Assistant Examiner—Courtney A. Bowers
Attorney, Agent, or Firm—Skjerven, Morrill, MacPherson, Franklin & Friel

[57] ABSTRACT

A semiconductor memory cell with an N-type conductivity capacitance implant region self-aligned with a polysilicon transfer gate is disclosed. In a first embodiment after a blanket capacitance implant, formation of the capacitance storage polysilicon gate and an overlying insulating layer, a plasma etch is used to define specific regions of the capacitance implant. In a second embodiment, a complementary implant step is used after formation of the insulating layer over the capacitance storage polysilicon gate. Subsequently, in both embodiments, a transfer gate is formed with an edge surface adjacent to and abutting the insulating layer over the capacitance storage gate and substantially aligned with an edge surface of the capacitance implant region.

10 Claims, 5 Drawing Sheets

METHOD OF ALIGNMENT FOR SEMICONDUCTOR MEMORY DEVICE

BACKGROUND OF THE INVENTION

1. Field of the Invention

This invention relates generally to a semiconductor DRAM memory cell and more specifically to a method for making a semiconductor DRAM memory cell with an N type conductivity capacitance implant region self-aligned with the gate of the access transistor.

2. Description of the Prior Art

FIG. 1 illustrates a high-capacity dynamic random access memory (DRAM) cell structure. The high-capacity DRAM cell structure 50 has two double level polysilicon cells $20_1$, $20_2$, each of which includes an access transistor 21 and a storage capacitor 22. In the figures, a single number without a subscript refers to like features in each of cells $20_1$, $20_2$ since the cells generally have mirror symmetry about the center of source region 13. For example, cell 20 refers to both cells $20_1$ and $20_2$.

DRAM cell 20 has a pocket 13 of N+ conductivity type formed in a P− conductivity type (P− type) semiconductor substrate 10. Pocket 13, which is part of a diffused bit line, functions as the source for access 21 transistor in both cell $20_1$ and cell $20_2$.

A deep P-type conductivity implant region 11, typically a boron implant, and a shallow N-type conductivity implant region 12, typically an arsenic implant, are each formed a selected distance from the edge of source region 13. The distance from the edge of source region 13 to edge Y of N-type conductivity implant 12 is the channel length of access transistor 21. P implant isolation region 14, a channel stop region, and field oxide region 15 are formed on the periphery of DRAM cell 50. A thin oxide layer 18 overlies implant regions 11, 12, and field oxide region 15. Thin gate oxide layer 27 overlies source region 13 and the channel region. A first polysilicon layer 16 is formed on oxide layer 18 over field oxide 15 and arsenic implant region 12 and boron implant region 11. First polysilicon layer 16 functions as a storage gate for capacitor 22 of cell 20. A transfer gate 19 is a second polysilicon electrode that is separated from the first polysilicon electrode by a silicon dioxide layer 17 and from the channel region and source 13 by silicon dioxide layer 27.

The double level polysilicon DRAM memory cell, as illustrated in FIG. 1, is widely used in DRAM arrays because the cell size is significantly reduced over other conventional charge storage DRAM cells. The charge from bit line 13 is transmitted directly to the area under storage gate 16 by the connection of inversion layers under the transfer gate 19 and storage gate 16.

The threshold voltage of transistor 21 is a function of the effective channel length and the coupling of capacitance arsenic region 12 to its polysilicon transfer gate 19. Therefore, variations introduced in either the effective channel length or the coupling of capacitance region 12 and transfer gate 19 by fabrication processes reduce yield because the process variations change the coupling in cells $20_1$, $20_2$ which in turn results in different threshold voltages for cells $20_1$, $20_2$.

The cells $20_1$ and $20_2$ (FIG. 1) are fabricated on a semiconductor chip having many thousands of similar cells and successful operation of the chip requires that all such cells on the chip be free of defects. The cells as shown are fabricated using conventional oxidation, masking, etching and ion implantation which are known to those skilled in the art. In fabrication of cell 20, positioning of edge Y of capacitance arsenic ion implant 12 with respect to the positioning of respective gate edge X is critical, because for proper operation of cell 50, raising the gate 19 voltage must access the information in the associated capacitor 22.

Thus, variations introduced by fabrication processes, discussed above, can directly affect the proper operation of cell 50. For example, edge $Y_1$ of capacitance arsenic ion implant region $12_1$ and the edge $Y_2$ of implant region $12_2$ are formed in the same process step. Specifically, an ion implant mask is used to define regions $12_1$, $12_2$. If the mask is misaligned, an acceptable positioning of one edge of the implant region 12 may lead to an unacceptable positioning of the other edge. The cell having acceptably aligned edges would function while the adjacent cell, having an unacceptably aligned edge of implant region 12, would not function. Therefore, yield is reduced by this alignment problem. The complexity of having a second level of polysilicon in the DRAM cell adds significantly to the processing cost. Accordingly, the mask misalignment and similar variations, which result in reduced yields, limit the advantages of the reduced cell size of the double level polysilicon approach.

SUMMARY OF THE INVENTION

The double level polysilicon self-aligned transistor memory cell for a dynamic random access memory of this invention eliminates mask misalignment problems associated with the capacitor implant region of prior art memory cells. The memory cell is formed in a semiconductor substrate with a source region and a capacitance region separated from the source region by a channel region. A first insulating layer extends over the capacitance region. A capacitance gate, having two ends and overlying the capacitance region, is formed on the first insulating layer. A second insulating layer is formed over the capacitance gate so that the second insulating layer has an edge surface formed over the end of the capacitance gate closest to the channel region. The edge surface of the second insulating layer is substantially aligned with the interface of the capacitance region and the channel region.

A third insulating layer abuts the second insulating layer and extends over the channel region and the source region. A transfer gate of the memory cell is formed over but insulated from the capacitance gate and formed over but insulated from the channel region. The transfer gate has a surface adjacent to and abutting the edge surface of the second insulating layer so that the surface of the transfer gate is substantially aligned with the interface of the capacitance region and the channel region. Further, a surface edge of the transfer gate, opposite to the surface adjacent to and abutting the edge surface of the second insulating layer, is substantially aligned with the interface of the channel region and the source region.

Unlike the prior art memory cells, the capacitance region in the memory cell of this invention is formed using a blanket implantation. Since this implantation is a blanket implantation, no mask is needed. Therefore, the mask misalignment problems of the prior art have been eliminated.

After the blanket capacitance implant, a polysilicon capacitance gate is formed by conventional processes over and insulated from the blanket implant region in the semiconductor substrate. An insulating layer is formed over the polysilicon capacitance gate so that an edge surface of the insulating layer is formed over an end surface of the capacitance gate. After formation of the insulating layer over the capacitance gate, the structure is etched so as to expose all areas of the substrate except those covered by the insulating layer over the capacitance gate. This structure is formed in both processes of this invention.

In the preferred embodiment, in the next process step the semiconductor substrate which is not covered by the insulating layer, i.e., the exposed semiconductor substrate, is etched to remove the region formed by the blanket capacitance implantation. This etching effectively uses the edge surface of the insulating layer as a mask to define the capacitance region.

In an alternative embodiment, after formation of the insulating layer an implant, complementary to the blanket capacitance implant, is performed over the exposed semiconductor substrate. In this embodiment, the edge surface of the insulating layer acts as a mask for the complementary implant to define the capacitance implant region.

The two alternative processes have been used to form the double level polysilicon self-aligned transistor memory cell of this invention with a surface of the transfer gate substantially aligned with the interface of the channel region and the capacitance region. The use of a insulating layer overlaying the polysilicon capacitance gate as a mask to define one edge of the capacitance implant region eliminates the misalignment of similar prior art cells and consequently the yields of the cell of this invention are enhanced over prior art cells. Further, the operating characteristics of the cell of this invention are more uniform than those of prior cells made by conventional processes.

DETAILED DESCRIPTION

Figure 2:
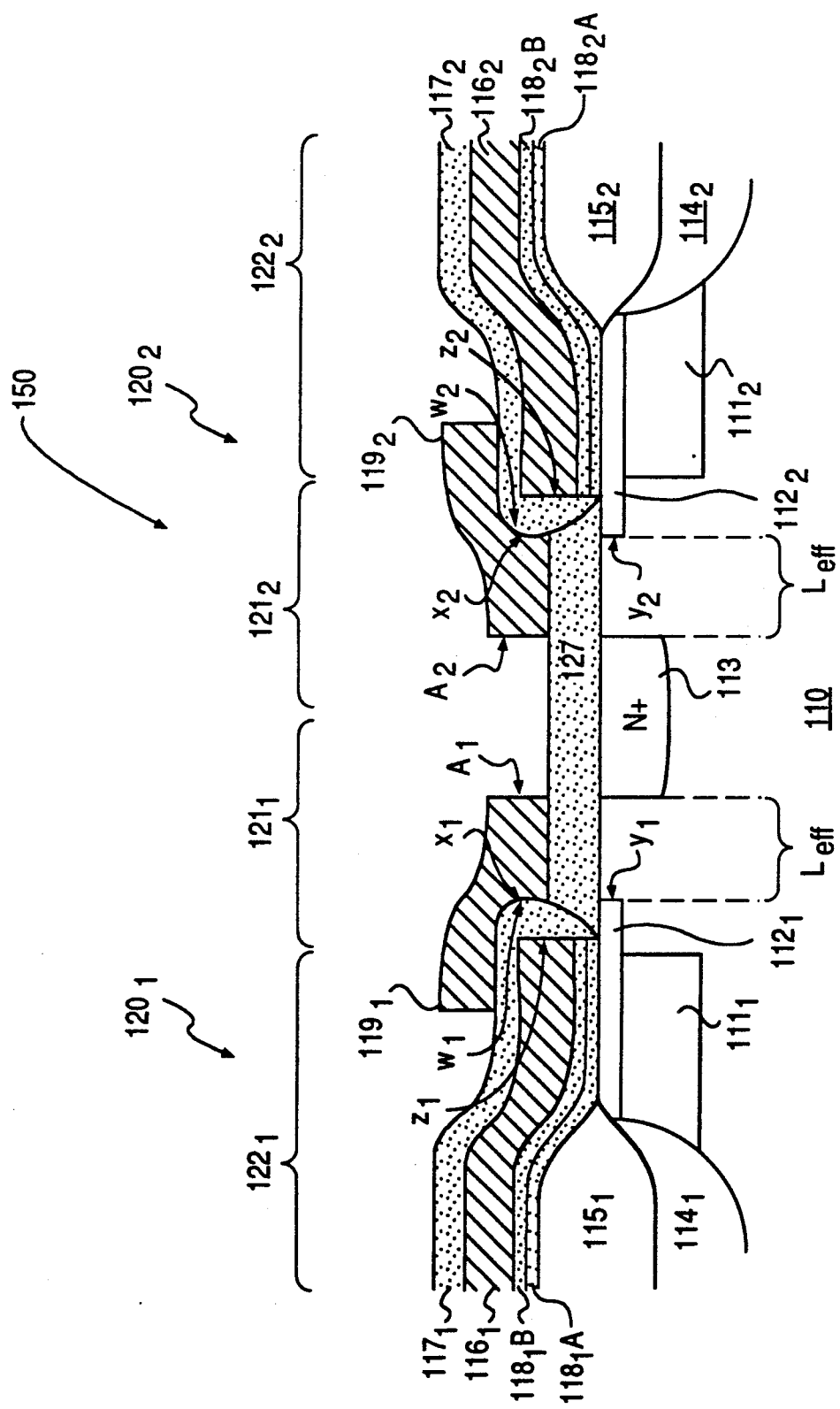
FIG. 2 illustrates a cross-sectional view of the double layer polysilicon self-aligned transistor memory cell for a dynamic random access memory of this invention.

DRAM memory cell 150 (FIG. 2) of this invention has a N+ conductivity type source region 113, which is part of a diffused bit line, a deep P conductivity type capacitance implant 111, a N conductivity type shallow capacitance implant 112, a P implant isolation region 114, sometimes called a channel stop region, and a field oxide region 115 all formed in a P− conductivity substrate 110. Here the terms "deep" and "shallow" are relative to the surface of substrate 110 on which the transistor of this invention is formed. A thin dielectric layer 118 is disposed on substrate 110 so that the dielectric layer 118 overlies capacitance implant regions 111, 112 and field oxide 115. In one embodiment as shown in FIG. 2, thin dielectric layer 118 is about 150 Å thick and consists of about a 50 Å silicon dioxide layer 118A overlain by about a 100 Å silicon nitride layer 118B. The actual thickness of the silicon dioxide layer and the silicon nitride layer can be varied to achieve a specified dielectric constant. For example, dielectric layer 118 can be made entirely from silicon dioxide, but the dielectric constant of a silicon dioxide layer is smaller than the dielectric constant of a silicon oxide/silicon nitride layer with the same total thickness.

Polysilicon capacitance storage gate 116 is formed over capacitance implant regions 111, 112 and subsequently covered by an oxide layer 117. Oxide layer 117 overlies the exposed upper surface of capacitance storage gate 116 and both vertical surfaces at the two ends of capacitance storage gate. Reference to a vertical surface herein refers to the orientation shown in the figures and means the direction orthogonal to the substrate surface. In one embodiment, oxide layer 117 is approximately 2000 Å thick. The edge surface W of oxide layer 117 over end Z of capacitance storage gate 116 is substantially aligned with an edge Y of capacitance implant 112. Polysilicon transfer gate 119 is formed over an oxide layer 127. Oxide layer 127 overlies the channel regions and source 113. Transfer gate 119 has a first surface X adjacent to and abutting edge surface W of oxide layer 117 so that surface X of transfer gate 119 is also substantially aligned with an edge Y of capacitance implant 112. An edge surface A of transfer gate 119 is substantially aligned with an edge surface of N+ source region 113.

The threshold voltage for transistor 121 of cell 120 (FIG. 2) of this invention is only a function of the effective channel length, $L_{eff}$, and the coupling of transfer gate 119 to capacitance region 112. The fabrication process for DRAM memory cell 150, as described below, assures that the coupling of the capacitance region 112 to its transfer gate 119 and the effective channel length $L_{eff}$ are approximately the same for each transistor 121 in cell 150.

The threshold voltage of an MOS transistor varies with the effective channel length. Since each transistor 121 in cell 150 has approximately the same effective channel length, the threshold voltages of transistors 121 are approximately equal. In the prior art MOS transistors, as described above, mask alignment errors resulted in transistors having different effective channel lengths and therefore different threshold voltages. Therefore, the difference between threshold voltages of transistors 121 (FIG. 2) in a DRAM array manufactured using the principles of this invention is less than the difference between threshold voltages of the transistors 21 (FIG. 1) in a prior art DRAM array.

Figure 1:
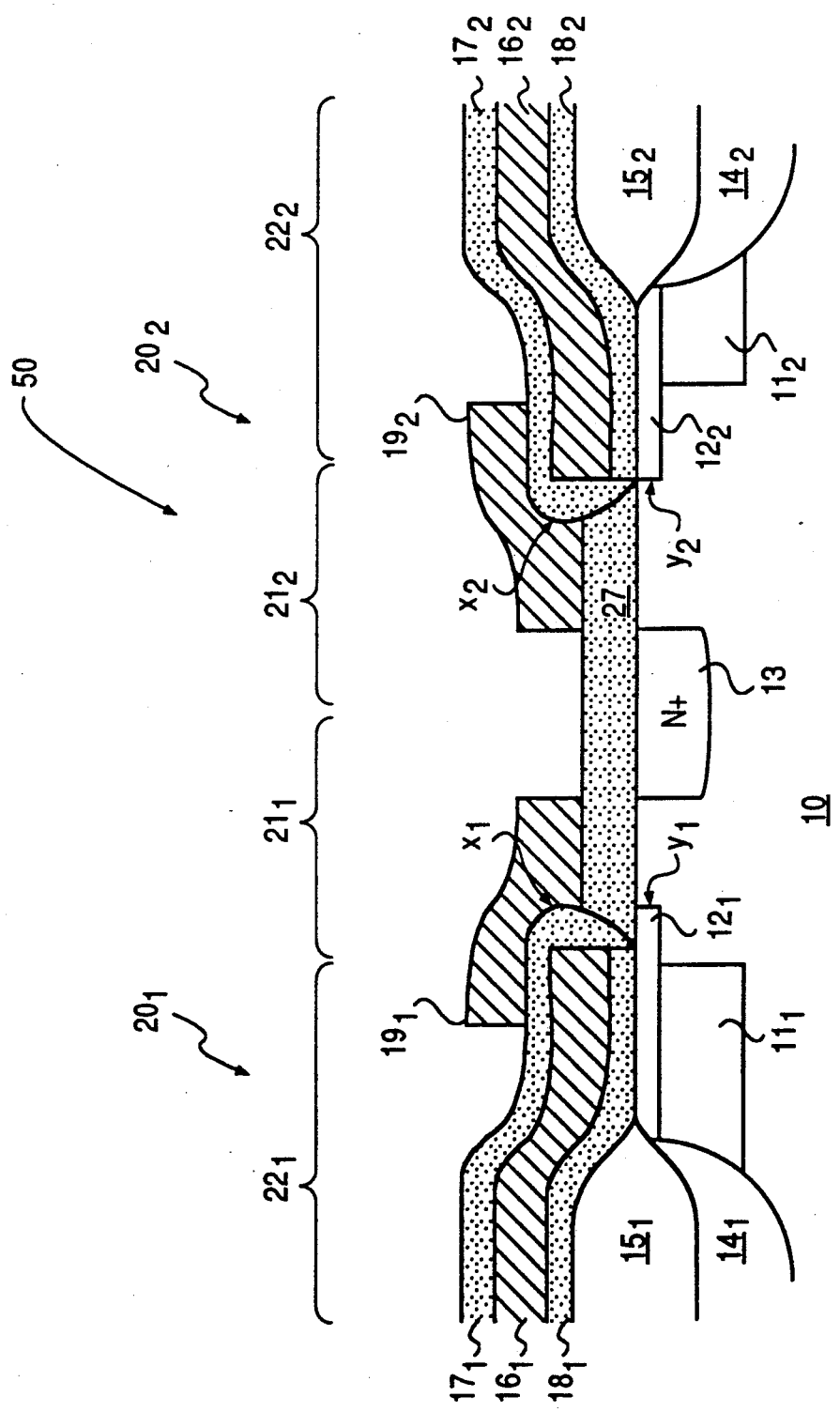
FIG. 1 illustrates a cross-sectional view of a prior art double level polysilicon memory cell for a dynamic random access memory.

Although memory cell 150 of this invention (FIG. 2) appears somewhat similar to prior art cell 50 (FIG. 1) the processing used to form memory DRAM cell 150 of this invention is based upon a discovery for positioning an edge Y of the capacitance arsenic implant region 112 substantially under and aligned with surface X of transfer gate 119, which is adjacent to and abutting an edge surface W of oxide layer 117, to achieve the enhanced performance previously described. Moreover, using the processing steps described below, mask misalignment problems associated with the capacitor implant regions are eliminated and consequently the yield for cell 150 (FIG. 2) of this invention is increased over the prior art cells 50 (FIG. 1).

As described above, memory cell 150 actually includes two cells $120_1$, $120_2$ which share source region 113. Accordingly, each of the reference numbers in the following description should be interpreted to represent two subscripted numbers in FIG. 2. For example, oxide layer 117 of cell 120 refers to oxide layer $117_1$ of cell $120_1$ and oxide layer $117_2$ of cell $120_2$. Cell structure 150 has generally mirror symmetry about the center of source region 113.

Conventional processing steps are used to form P+ implant isolation area 114, field oxide layer 115 and dielectric layer 118 of memory cell 150 (FIG. 2). Specifically, a P− type semiconductor substrate 110 is masked so that only the regions for P type isolation regions 114, the channel stop region, are uncovered. Ion implantation followed by oxidation is used to form P implant isolation area 114 and field oxide layer 115. After formation of oxide layer 115, a triple etch removes the mask.

Figure 3A:
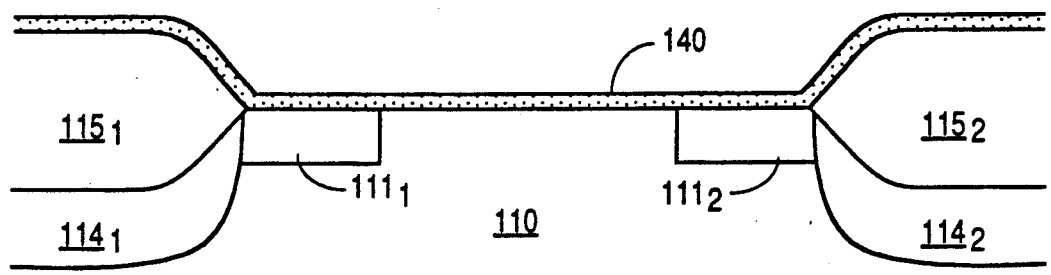
FIGS. 3A through 3E illustrate cross-sectional views of the double level polysilicon self-aligned transistor memory cell of this invention after selected processing steps.

After the mask is removed, substrate 110 is oxidized to form a 400 Å "sacrificial" oxide layer 140 (FIG. 3A). Oxide layer 140 is then covered by a capacitance boron mask and ion implantation is used to form deep capacitance boron implant regions 111. In one embodiment, a 100 Kev ion implantation with a dose of $5 \times 10^{12}$ atoms/cm$^2$ was used.

The process steps used to form the channel stop region 114, field oxide region 115, and capacitance boron implant region 111 are the same as the process steps used to form prior art cell 50 (FIG. 1).

Figure 3B:
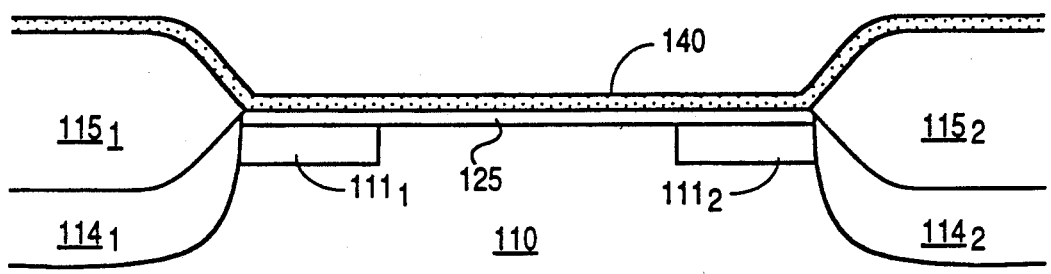

After boron implant regions 111 are formed the capacitance boron mask is removed and substrate 110, as illustrated in FIG. 3A, is subjected to a blanket capacitance arsenic ion implantation to form the structure illustrated in FIG. 3B. In one embodiment, a 150 Kev implantation which has an average range of 850 Å with a dose of $5 \times 10^{12}$ atoms/cm$^2$ was used. This blanket implantation forms a shallow N type conductivity region 125 in all regions of substrate 110 (FIG. 3B) except those covered by field oxide 115. In prior art cell 50 (FIG. 1), a mask and ion implantation were used to form capacitance arsenic implant region 12. The process of this invention does not use a mask for the arsenic ion implantation and accordingly the entire exposed surface is implanted rather than specific regions of the surface as in the prior art process.

Figure 3C:
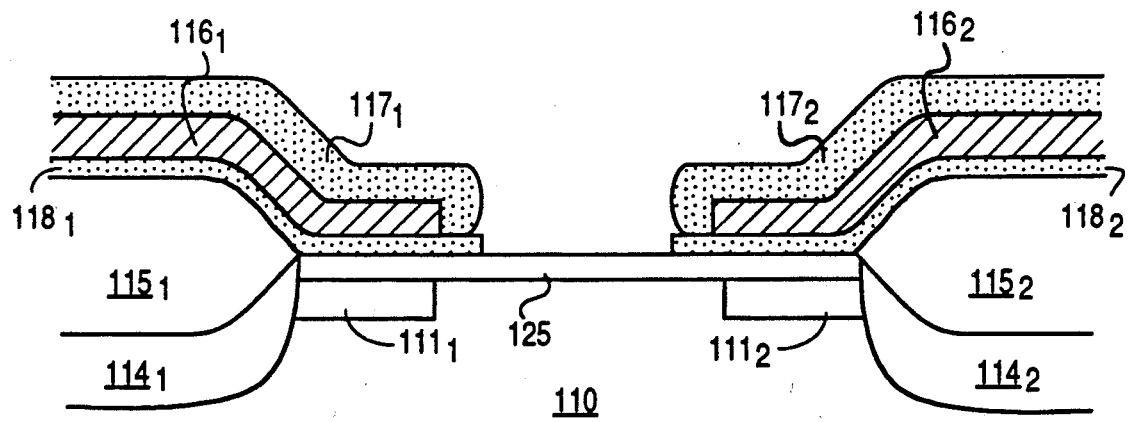

After blanket capacitance arsenic ion implantation "sacrificial" oxide layer 140 is removed. A 50 Å silicon dioxide ("oxide") layer 118A (FIG. 2) is formed on substrate 110 and then a 100 Å silicon nitride layer 118B is formed over oxide layer 118A. The silicon dioxide layer and the silicon nitride layer are formed using processing techniques known to one skilled in the art. In FIG. 3C, dielectric layer 118 represents the sandwiched silicon dioxide/silicon nitride dielectric layer.

Sandwiched dielectric layer 118 is illustrative only and is not intended to limit the scope of this invention. DRAM cell 150 of this invention can be implemented with only a silicon dioxide layer, only a silicon nitride layer, a sandwiched layer with varying thicknesses of silicon dioxide and silicon nitride, or some other dielectric material. The important aspect is the dielectric constant of layer 118. Once a specific material or materials are selected, the thickness of layer 118 can be varied to give the desired dielectric constant using methods known to those skilled in the art.

After formation of layer 118, capacitance polysilicon layer 116 is patterned and formed using conventional processing techniques known to one skilled in the art. (FIG. 3C.) Similarly, oxide layer 117 is formed over capacitance polysilicon 116 using conventional processes to a thickness of approximately 1000–2000 Å, preferrably about 2000 Å. The thickness of oxide layer 117 is an important aspect of this invention, because, as described below, the oxide edge surface W overlaying surface Z of capacitance polysilicon 116 (FIG. 2) is used to define the capacitance arsenic implant region in cell 150. After oxide layer 117 (FIG. 3C) is formed, the structure is triple etched so that dielectric layer 118 is removed from all regions of substrate 110 except those protected by oxide layer 117.

Two alternative processing methods have been developed for forming memory cell 150 (FIG. 2) of this invention after formation of the structure as shown in FIG. 3C. In the preferred embodiment, after formation of capacitance oxide layer 117 and the subsequent triple etch, a directional plasma etching was used to etch away a portion 126 (FIG. 3D), 2000–3000 Å in one embodiment, of substrate 110 between oxide layer $117_1$ and oxide layer $117_2$ including the area of the blanket capacitance arsenic implant region 125.

Figure 3D:
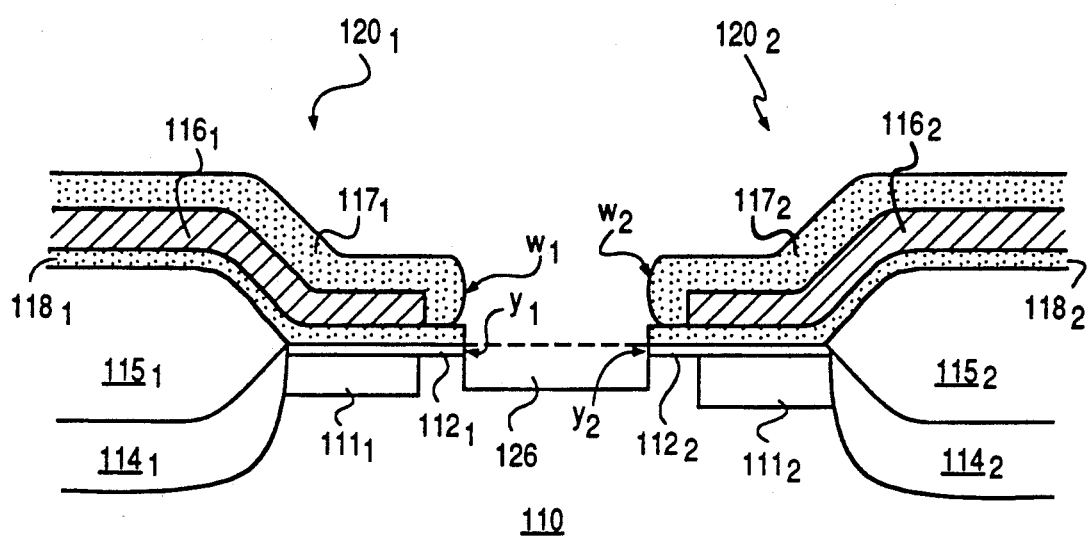
Figure 3E:
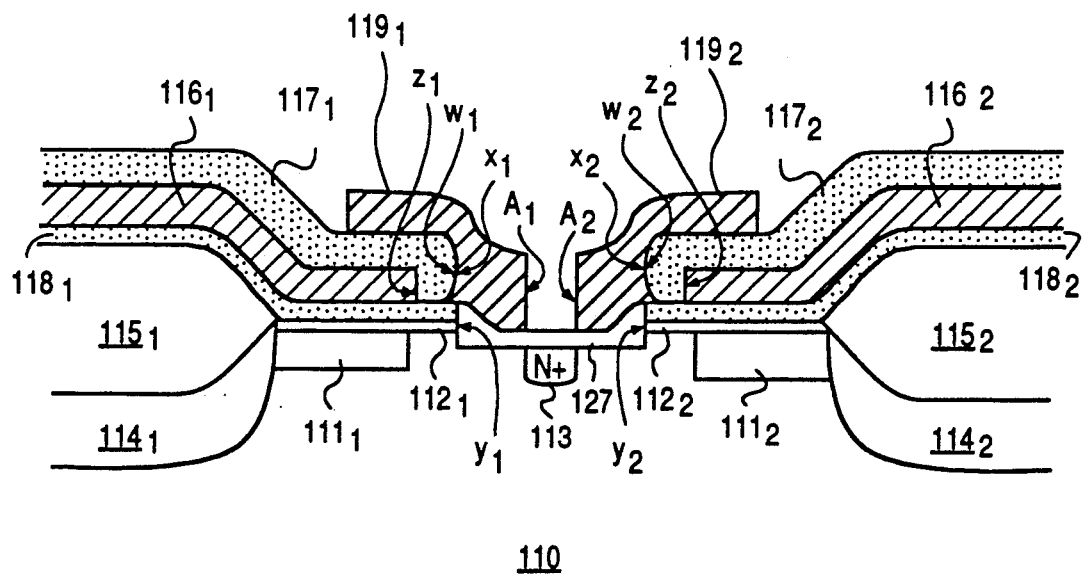

In the plasma etching, sulfur hexafluoride and a fluorinated gas, such as Freon-12 ($CCl_2F_2$), were used. The power was about 300 watts and the pressure about 10 pascals. The plasma etch process required about 8 minutes to achieve the 2000–3000 Å etch. The plasma etching configures blanket capacitance arsenic implant region 125 into capacitance implant region $112_1$ of cell $120_1$ and capacitance implant region $112_2$ of cell $120_2$ (FIG. 3D). Surface Y of region 112 is substantially aligned with the edge surface W of oxide layer 117. After the plasma etching, thin gate oxide layer 127, 380 Å thick in one embodiment, is first formed and then polysilicon transfer gate 119, source region 113, and the diffused bit line (not shown) are formed using conventional processes (FIG. 3E). In one embodiment, surface A of transfer gate 119 is used as a mask for the formation of source region 113 so that source region 113 is self-aligned with surface A of transfer gate 119.

According to the principles of this invention, surface Y of capacitance arsenic implantation region 112 and surface X of polysilicon gate 119, which is formed adjacent to and abutting edge surface W of oxide layer 117, are oriented so that capacitance arsenic ion implant region 112 is generally below and substantially aligned with surface X of polysilicon gate 119. Accordingly, the channel length of transfer transistor 121 under gate 119 is effectively controlled. Further, each of the cells in an array of DRAM cells are formed by an identical process, which is independent of mask alignment for the definition of the capacitance arsenic ion implant region. Thus, each access transistor 121 (FIG. 2) in the array of DRAM cells has approximately the same effective channel length. Yield limitations imposed by mask alignment for the capacitance arsenic ion implant step of the prior art have been eliminated.

Moreover, the difference in threshold voltage of two transistors 121 in a cell 150 is a function only of the effective channel length and the alignment accuracy between polysilicon gate layer 119 and capacitance polysilicon layer 116. The difference in threshold voltages of two transistors 21 in prior art memory cell 50 (FIG. 1), in addition to these two factors, also depended upon the accuracy of the alignment of the arsenic capacitance implant mask and the pattern of field oxide 15. Therefore, the performance characteristics of each cell 150 (FIG. 2) in an array of cells formed on a chip using the principles of this invention are more uniform than the performance characteristics of prior art cell 50 (FIG. 1). Further, since one mask alignment step has been eliminated, the production of the DRAM array of this invention is cheaper and easier than the production of the prior art double level polysilicon DRAM array.

Figure 4A:
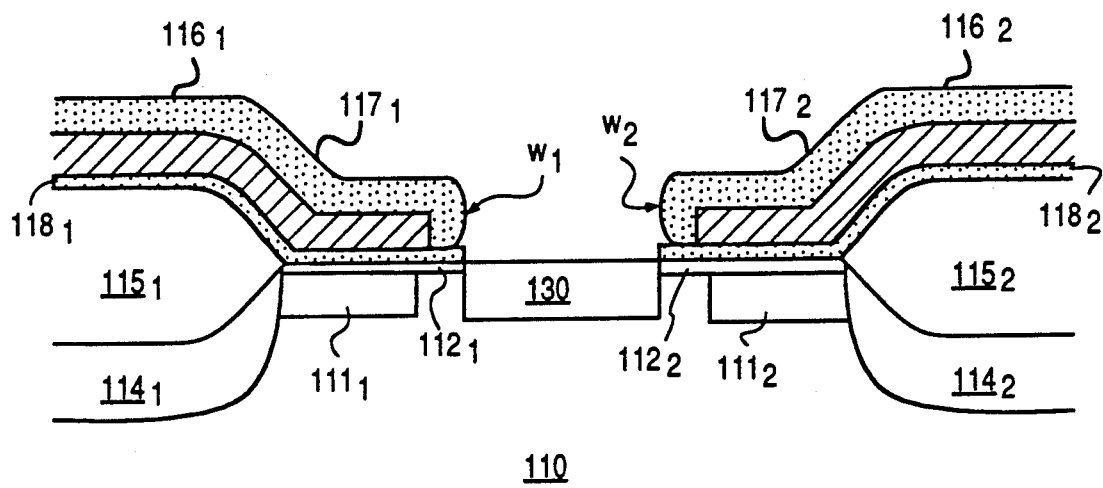
FIGS. 4A and 4B illustrate cross-sectional views of the double level polysilicon self-aligned transistor of this memory cell of this invention according to an alternative processing method.
Figure 4B:
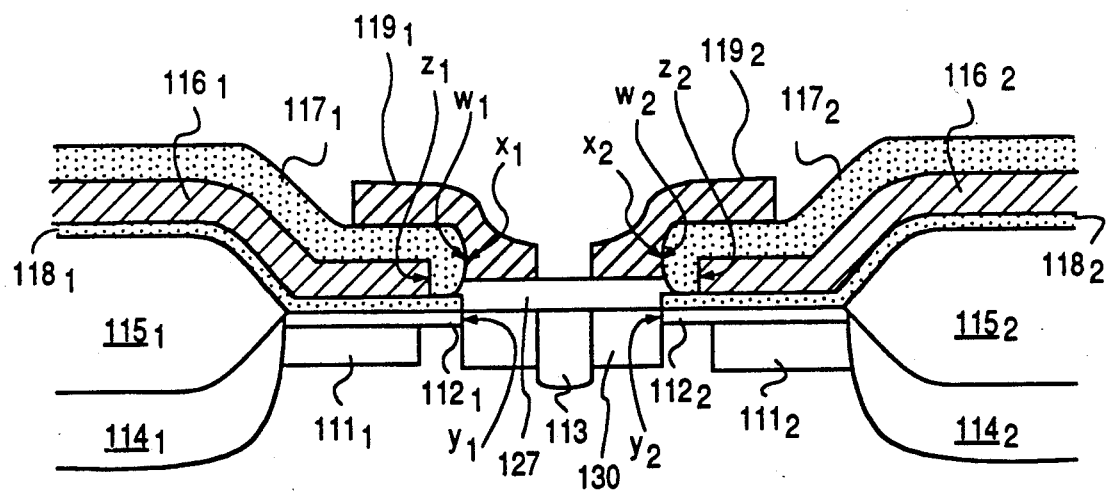

In an alternative embodiment, following formation of oxide layer 117 and the subsequent triple etch (FIG. 3C) a complementary boron implant 130 (FIG. 4A) is performed over the entire substrate 110. In one embodiment, the energy of the implant was 30 Kev and the dose was about $7 \times 10^{12}$ to $1 \times 10^{13}$ atoms/cm$^2$. The complementary boron implant is also done without a mask, but oxide layer 117 effectively functions as a mask so that substantially vertical surface W of oxide layer 117 defines the extent of capacitance region 112. After the complementary implant, gate oxide layer 127 (FIG. 4B), about 380 Å thick in one embodiment, was formed.

In the next processing step, transfer gate 119 is formed with a surface X adjacent to and abutting surface W of oxide layer 117 so that capacitance arsenic implantation region 112 is self-aligned with the surface X of transfer gate 119. Since the complementary boron implant is performed simultaneously for all cells on the chip, the edge Y of the capacitance arsenic implant region in each cell is properly aligned with the related surface X of transfer gate 119.

After the complementary blanket implantation, oxide layer 127, transfer gate 119 and source region 113 are formed using conventional processes. This fabrication process produces a cell having the same advantages over the prior art as previously described for cell 150 in FIG. 3E.

While two alternative processes have been described for forming a double level polysilicon self-aligned transistor memory cell in a DRAM memory array, the specific embodiments are illustrative only and are not intended to limit the scope of the invention. For example, implant regions have been described in terms of a boron implant and an arsenic implant. These implants are generally descriptive of a P type conductivity implant and an N type conductivity implant. Moreover, these processes are illustrative of means to form areas of conductivity in a chip having the specified relationships and other processes known to those skilled in the art could be used to form conductivity areas having the specified relationship.

I claim:

1. A transistor memory cell comprising:
a semiconductor substrate containing a source region and a capacitance region, the source region being separated from the capacitance region by a channel region wherein a first edge of the channel region is adjacent to the capacitance region and a second edge of the channel region is adjacent to the source region;
a first insulating layer disposed on the substrate over the capacitance region wherein said first insulating layer has a end surface located over the capacitance region;
a capacitance gate positioned over and contacting the portion of the first insulating layer overlying the capacitance region;
a second insulating layer disposed on the capacitance gate and having an edge surface remote from the capacitance gate wherein the first edge of the channel region is self-aligned with said second insulating layer edge surface;
a third insulating layer disposed on the substrate over the source region and the channel region wherein said third insulating layer has an end surface adjacent to and abutting said end surface of said first insulating layer; and
a transfer gate formed on the third insulating layer over the channel region, and on the second insulating layer, the transfer gate having a surface adjacent to and abutting said edge surface of said second insulating layer wherein said surface of the transfer gate is self-aligned with the first edge of the channel region.

2. The transistor memory cell of claim 1 wherein an edge surface of the transfer gate is aligned with the second end of the channel region.

3. The transistor memory cell of claim 1 having a second capacitance implant region formed adjacent to the first-mentioned capacitance region and extending further into the substrate than the first-mentioned capacitance region, the second capacitance implant region having a conductivity opposite to the conductivity of the first-mentioned capacitance region.

4. The transistor memory cell of claim 1 wherein the memory cell is part of an array of such cells, each cell having a surface of the transfer gate self-aligned with the first edge of the channel region for that cell.

5. The transistor memory cell of claim 1 wherein the first insulating layer comprises a first layer of silicon dioxide overlain by a second layer of silicon nitride.

6. The transistor memory cell of claim 5 wherein the silicon dioxide layer is approximately 50 Å thick and the silicon nitride layer is approximately 100 Å thick.

7. The transistor memory cell of claim 1 wherein the second insulating layer comprises a silicon dioxide layer.

8. The transistor memory cell of claim 7 wherein the second insulating layer is approximately 2,000 Å thick.

9. The transistor memory cells of claim 1 wherein the third insulating layer comprises a silicon dioxide layer.

10. The transistor memory cell of claim 9 wherein the third insulating layer is approximately 380 Å thick.

* * * * *